US007535394B2

(12) United States Patent
Pupalaikis

(10) Patent No.: US 7,535,394 B2
(45) Date of Patent: May 19, 2009

(54) HIGH SPEED ARBITRARY WAVEFORM GENERATOR

(75) Inventor: Peter J. Pupalaikis, Ramsey, NJ (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

(21) Appl. No.: 11/827,082

(22) Filed: Jul. 10, 2007

(65) Prior Publication Data

US 2009/0015453 A1 Jan. 15, 2009

(51) Int. Cl.
*H03M 1/66* (2006.01)

(52) U.S. Cl. ....................................... 341/144; 341/145

(58) Field of Classification Search ................. 341/144; 370/480; 455/450

See application file for complete search history.

(56) References Cited

U.S. PATENT DOCUMENTS 3,783,413 A 1/1974 Froment et al.
3,891,803 A 6/1975 Daguet et al.
3,903,484 A 9/1975 Testani
4,316,282 A 2/1982 Macina et al.
4,354,277 A 10/1982 Crackel et al.
5,187,803 A 2/1993 Sohner et al.
5,469,219 A 11/1995 Mortensen
5,659,546 A 8/1997 Elder
5,668,836 A 9/1997 Smith et al.
5,950,119 A 9/1999 McGeehan et al.
5,978,742 A 11/1999 Pickerd
6,240,150 B1 5/2001 Darveau et al.
6,271,773 B1 8/2001 Kobayashi
6,340,883 B1 1/2002 Nara et al.
6,380,879 B2 4/2002 Kober et al.
6,433,720 B1 8/2002 Libove et al.
6,542,914 B1 4/2003 Pupalaikis
6,567,030 B1 5/2003 Pupalaikis
6,642,878 B2 11/2003 Libove et al.
6,701,335 B2 3/2004 Pupalaikis
6,819,279 B2 11/2004 Pupalaikis
7,050,918 B2 5/2006 Pupalaikis et al.
7,058,548 B2 6/2006 Pupalaikis et al.
7,139,684 B2 11/2006 Pupalaikis et al.
7,219,037 B2 5/2007 Pupalaikis et al.
7,222,055 B2 5/2007 Pupalaikis et al.
2002/0150173 A1 10/2002 Buda
2002/0181614 A1 12/2002 Mostafa et al.
2003/0016701 A1* 1/2003 Hinson ....................... 370/480
2004/0041599 A1 3/2004 Murphy et al.

(Continued)

FOREIGN PATENT DOCUMENTS

EP 0275136 7/1988

(Continued)

OTHER PUBLICATIONS

"Putting undersampling to work", *Pentek, Inc*, 1-2.

(Continued)

*Primary Examiner*—Rexford Barnie
*Assistant Examiner*—Joseph Lauture
(74) *Attorney, Agent, or Firm*—Gordon Kessler

(57) ABSTRACT

A high-speed arbitrary waveform generator (AWG) that utilizes multiple digital-to-analog converters (D/A converters) and overcomes bandwidth limitations of individual D/A converters to produce high-speed waveforms.

14 Claims, 4 Drawing Sheets

U.S. PATENT DOCUMENTS

| | | | | |
|---|---|---|---|---|
| 2004/0142696 | A1 * | 7/2004 | Saunders et al. | 455/450 |
| 2004/0246047 | A1 | 12/2004 | Manku et al. | |
| 2004/0252044 | A1 | 12/2004 | Mathis et al. | |
| 2006/0247870 | A1 | 11/2006 | Pickerd | |
| 2006/0267811 | A1 | 11/2006 | Tan | |

FOREIGN PATENT DOCUMENTS

| | | |
|---|---|---|
| EP | 0589594 | 3/1994 |

OTHER PUBLICATIONS

"Sampling and reconstruction of periodic signals", DSP-FPGA. COM, 1-15.
"Electronics engineers' handbook", (1975).
"Real-time spectrum analysis tools aid transition to third-generation wireless technology", *Tektronix, Inc*, (1999),1-6.
"A matter of time: Today's RF signals call for a different kind of spectrum analysis", *Tektronix, Inc*, (2000),1-8.
"Signature—high performance signal analyzer 100Hz to 8GHz", *Anritsu*, (2000),1-2.
"Agilent E5052A signal source analyzer 10MHz to 7GHz", *Agilent Technologies*, (Jun. 9, 2004), 1, 6, 7.
"R3681 Signal analyzer", *Advantest*, (2004),1-2.
Paquelet, Stephanie et al., "RF front-end considerations for SDR Ultra-wideband communications systems", *RF Design*, (Jul. 2004),44-51.
Apolinario, Jr, J.A. et al., "On perfect reconstruction in critically sampled frequency-domain scrambler", 1-4.
Johannson, Hakan et al., "Reconstruction of Nonuniformly sampled bandlimited signals by means of digital fractional delay filters", IEEE Transactions on signal processing vol. 50 No. 11,(Nov. 2002),2757-2767.
Velazquez, Scott R., "High-performance advanced filter bank analog-to-digital converter for universal RF receivers", *V Company, IEEE*, (1998),229-232.
Lee, Hyung-Jin et al., "Frequency domain approach for CMOS ultra-wideband radios", *Proceedings for the IEEE computer society annual symposium on VLSI*, (2003),1-2.
Ding, G et al., "Frequency-interleaving technique for high-speed A/D conversion", *IEEE*, (2003),I857-I860.
Velazquez, Scott R., et al., "Design of hybrid filter banks for analog/digital conversion", *IEEE transactions on signal processing* vol. 46, No. 4, (Apr. 4, 1998),956-967.
Hoyos, Sebastian et al., "Analog to digital conversion of ultra-wideband signals in orthogonal spaces", *IEEE*, (2003),47-51.
Lyons, Richard G., "Understanding digital signal processing", *Prentice Hall professional technical reference, second edition*, (2004),30-39, 346-360, 471-479, 571-572.
Luo, Xiliang et al., "Real-time speech frequency scrambling and descrambling", 1-17.
"Advanced transmission library: Optional block function library for hypersignal block diagram/ride", *Hyperception, Inc*, (1997),1-2.
"Japanese abstract of JP 06 197019", *Hitachi Denshi., LTd*, (Jul. 15, 1994).
Adam, Stephen F., "Microwave Theory and Applications", *Prentice Hall*, (1969),490-500.
"Genesys, 2004 RF Microwave Design Software—Simulation", *Eagleware Corporation*, (2004),108-110.
Smith, Julius O., "MUS420/EE367A Lecture 4A, Interpolated Delay Lines, Ideal Bandlimited Interpolation, and Fractional Delay Filter Design", *Stanford University*, 1-50.
Mueller, James J., et al., "Method and Apparatus for Artifact Signal Reduction in Systems of Mismatched Interleaved Digitizers", U.S. Appl. No. 11/280,493, filed Nov. 16, 2005.
Jong, "Methods of Discrete Signal and Systems Analysis", *McGraw-Hill*, (1982),369-373.
Pupalaikis, Peter J., et al., "Method of Crossover Region Phase Correction when Summing Multiple Frequency Bands", U.S. Appl. No. 11/280,671, filed Nov. 16, 2005.
Pupalaikis, Peter J., "Bilinear Transformation Made Easy", *ICSPAT 2000 Proceedings, CMP Publications*, (2000),1-5.
"Digital Signal Processing Applications Using the ADSP-2100 Family", *Prentice Hall*, (1990),458-461.
"Agilent E8267D PSG Vector Signal Generator Data Sheet", *Agilent Technologies*, (Nov. 11, 2006),1-32.
"Agilent PSG Signal Generators", *Agilent Technologies*, (Mar. 9, 2006),1-24.

* cited by examiner

HIGH SPEED ARBITRARY WAVEFORM GENERATOR

FIELD OF THE INVENTION

The present invention relates in general to an arbitrary waveform generator (AWG) and in particular to a high-speed AWG.

BACKGROUND OF THE INVENTION

In the generation of high speed analog signals, it is often useful to generate these signals from digital signals. This is because digital signals are in a form most easily manipulated by digital computers and digital signal processors. In this situation, a device called a digital-to-analog converter (DAC or D/A converter) is utilized to convert digital waveforms to analog. These devices have basic limitations on speed and signal-fidelity. The speed limitations are expressed by two parameters: bandwidth and sample-rate. Sample-rate limitations are traditionally overcome through time-interleaving. There have been no easy ways to overcome bandwidth limitations. What is needed are waveform generators with high bandwidth and high sample-rate.

OBJECTS OF THE INVENTION

It is an object of this invention to overcome the bandwidth limitations encountered in the design of high-speed waveform generators.

Still other objects and advantages of the invention will in part be obvious and will in part be apparent from the specification and drawings.

SUMMARY OF THE INVENTION

In order to overcome the bandwidth limitations of high-speed waveform generators, a novel method is utilized whereby a digital waveform is preferably processed and separated for delivery to multiple D/A converters. Each D/A converter is inherently limited in bandwidth. Each waveform delivered to a particular D/A converter contains a portion of the total spectral content of the original waveform, but processed in such a manner such that it meets the D/A converters bandwidth criteria. These multiple D/A converters generate signals whereby each signal is processed in an analog fashion and combined such that the combined signal occupies the desired bandwidth, and the spectral content of the output signal substantially matches the spectral content of the original digital waveform despite the fact that it was generated using D/A converters each having insufficient bandwidth to independently generate the waveform.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
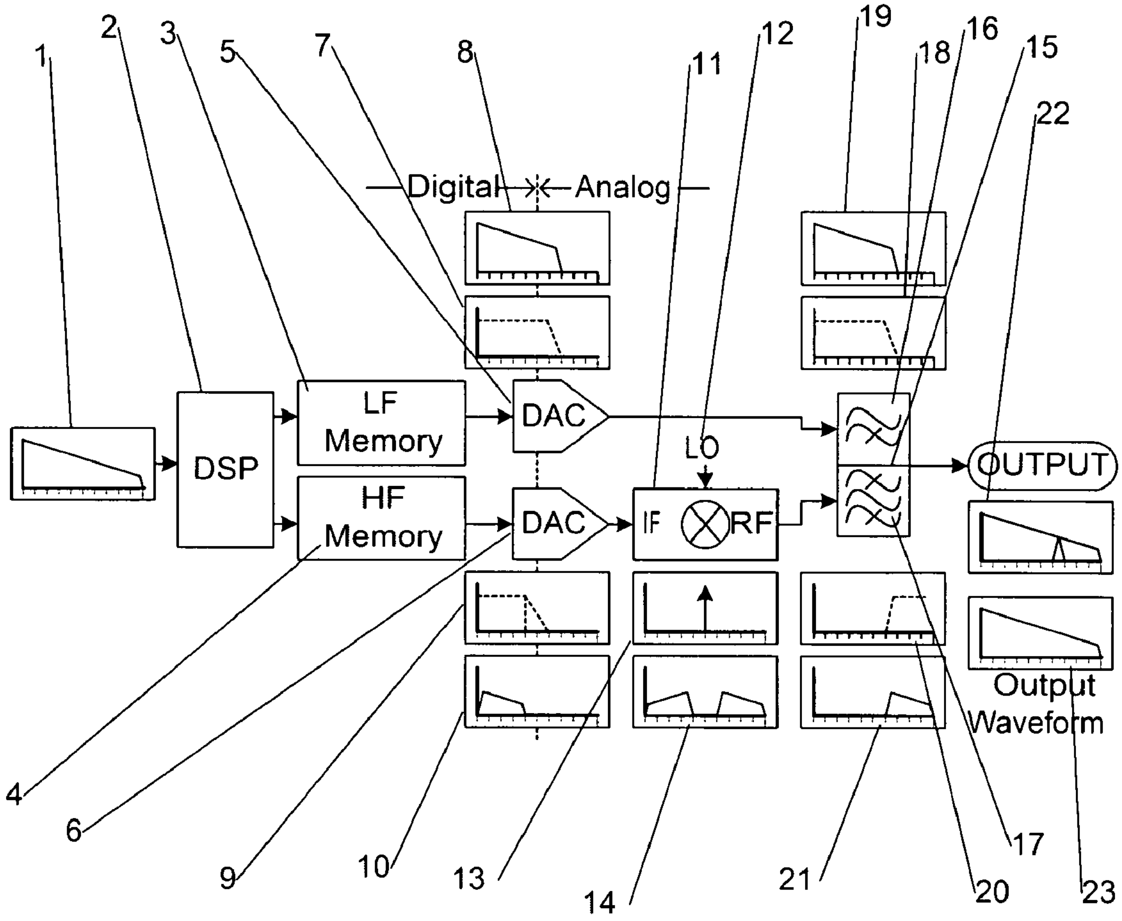
FIG. 1 is a drawing of a high-speed waveform generator according to the present method.

FIG. 1 shows an arbitrary waveform generator constructed in accordance with to the present invention. The generation of high-speed signals starts with designation of a desired waveform [1] where it is understood that the desired waveform [1] is in digital form or has a possible digital representation. It is also understood that the desired waveform [1] is shown as spectral content (i.e. in the frequency-domain) as opposed to an equivalent time-domain representation as will all waveforms described. This is only because the present method is best understood by examination from a frequency-domain perspective. The invention may also be applied to a time-domain defined signal.

It should be pointed out that traditionally, this digital waveform would have been presented to a D/A converter such as D/A converter [5] either directly or through a high-speed memory element such as [3]. But the response of the D/A converter [7] shows that it has insufficient bandwidth to generate the desired signal. Furthermore, by utilizing multiple D/A converters and memories in a traditional manner, while capable of increasing sample-rate through the well known technique of time interleaving, cannot overcome the bandwidth limitations. To clarify, when one says that a given D/A converter has a given bandwidth, it defines a characteristic of the D/A converter; the characteristic being the distance, in frequency, between the highest frequency and the lowest frequency that a D/A converter can produce. For example, if a D/A converter can produce waveforms with spectral content from DC to 2 GHz, one says that the D/A converter has a, bandwidth of 2 GHz.

Therefore, in accordance with the present method, the desired waveform [1] is processed utilizing digital signal processing (DSP) indicated by the DSP processing block [2] in a manner that will be described subsequently in detail to produce two digital waveforms. One waveform is presented either either directly or through a memory element [3] to a. D/A converter [5] designated as low-frequency, or LF. Another waveform is presented either directly or through a, memory element [4] to a D/A converter [6] designated as high-frequency, or HF, and is a downconverted portion of the desired waveform [1].

The LF D/A converter [5] is either physically limited to, or has been restricted by the DSP processing [2] to have a given transfer characteristic [7]. This means that the output of the D/A converter [5] has frequency content [8] corresponding to only a portion of [1].

Furthermore, HF D/A converter [6] is either physically limited to, or has been restricted by the DSP processing [2] to have a given transfer characteristic [9]. This means that the output of the D/A converter [5] has frequency content [10] corresponding to only the downconverted portion of [1].

The output of HF D/A converter [6] is presented to an upconverter [11]. Upconverter [11] utilizes a local oscillator (LO) [12], whose content is indicated by [13] and whose generation will be explained subsequently, to produce images [14], at least one of which corresponds ideally to a portion of [1] in the correct frequency locations.

All processed D/A converter outputs are presented to a diplexer [15] which has a low frequency side [16] with ideally a low-pass response characteristic [18] and a high frequency side [17] with ideally a band-pass characteristic [20]. The diplexer [15] serves to combine the signals [19] and [21] shown at [22] thereby producing an output waveform [23] that is an analog waveform that substantially represents the digital desired waveform [1].

Figure 2:
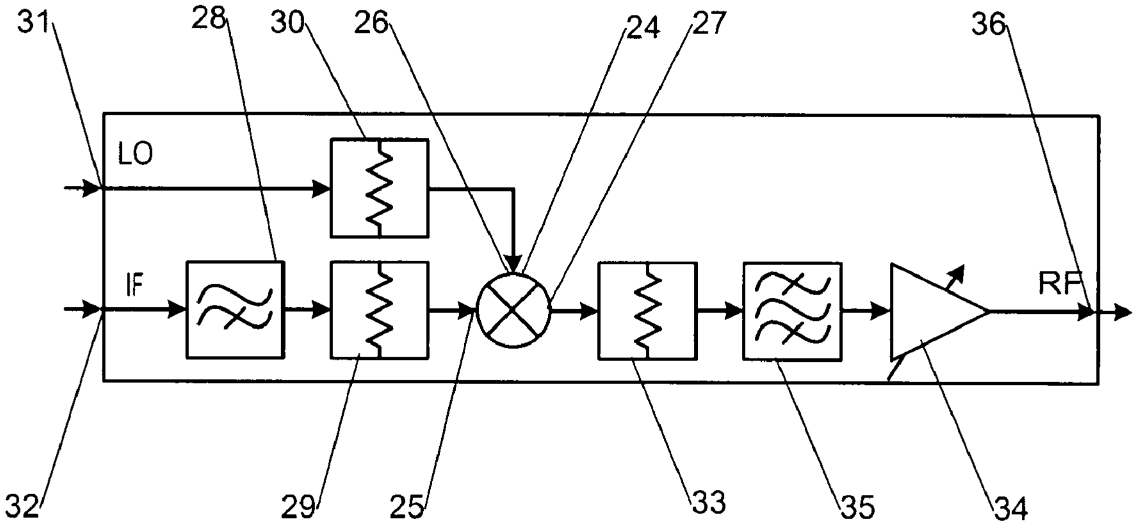
FIG. 2 is a drawing of a basic upconverter.

FIG. 2 represents detail of a typical upconverter element, such as that shown at [11] in FIG. 1. Intermediate frequency (IF) or baseband frequency signals enter the IF input [32]. The signals may be filtered using a low-pass filter [28]. Usually, the signals are attenuated with an attenuator [29] to reach a power level sufficient for low distortion mixing by the mixer [24]. The attenuator [29] also pads the input to provide a better impedance match between the IF input [32] and the mixer IF port [25]. If the power level at the IF input [32] is variable, then there may also be some form of variable attenuation or variable gain to supply the mixer IF input [25] with the correct power level. Depending on impedance matching requirements attenuators may also be placed before the low-pass filter [28]. Many different arrangements are possible in the path between the IF input [32] and the mixer IF port [25] and the tradeoffs of various configurations are well known to those skilled in the art of microwave and RF design. An LO is applied to the LO input port [31]. The LO is a periodic waveform, usually a sinusoid at a single frequency. It can also be a train of pulses in a sampler arrangement. A pad [30] is also usually placed between the LO input port [31] and the mixer LO port [26] to provide a better impedance match. Usually, to avoid distortion, the power level at the LO input port [31] is high. If the power level at the LO input port [31] is insufficient, gain or attenuation may be provided. Also, if the spectral content of the signal provided at the LO input port [31] is inadequate, filtering may also be provided. Many different arrangements are possible in the path between the LO input [31] and the mixer LO port [26] and the tradeoffs of various configurations are well known to those skilled in the art of microwave and RF design.

The mixing action of mixer [24] causes two images or sidebands of the signal present at the mixer IF port [25] to appear at the mixer RF port [27]. These images are at sum and difference frequencies between the spectral content of the signals at the LO port [26] and the IF port [25]. In a preferred embodiment, a band-pass filter [35] may be provided to retain only a desired portion of the spectral content of signal at the mixer RF port [27]. There may be a large amount of leakage between the LO port [26] and the RF port [27], which may require filter [35] to at least filter out the spectral content of the LO present in the converted signal. In addition to some filtering, a pad [33] may be supplied to improve the impedance match at the RF port [27]. In a preferred embodiment, a variable gain amplifier (VGA) [34] may be provided so that the output power of the signal at the RF output port [36] can be varied. Some other options include variable attenuation and fixed gain as well as additional filtering and padding to reduce spurious and reflections. The features and tradeoffs involved in the various options are well known to those skilled in the art of microwave and RF design.

Figure 3:
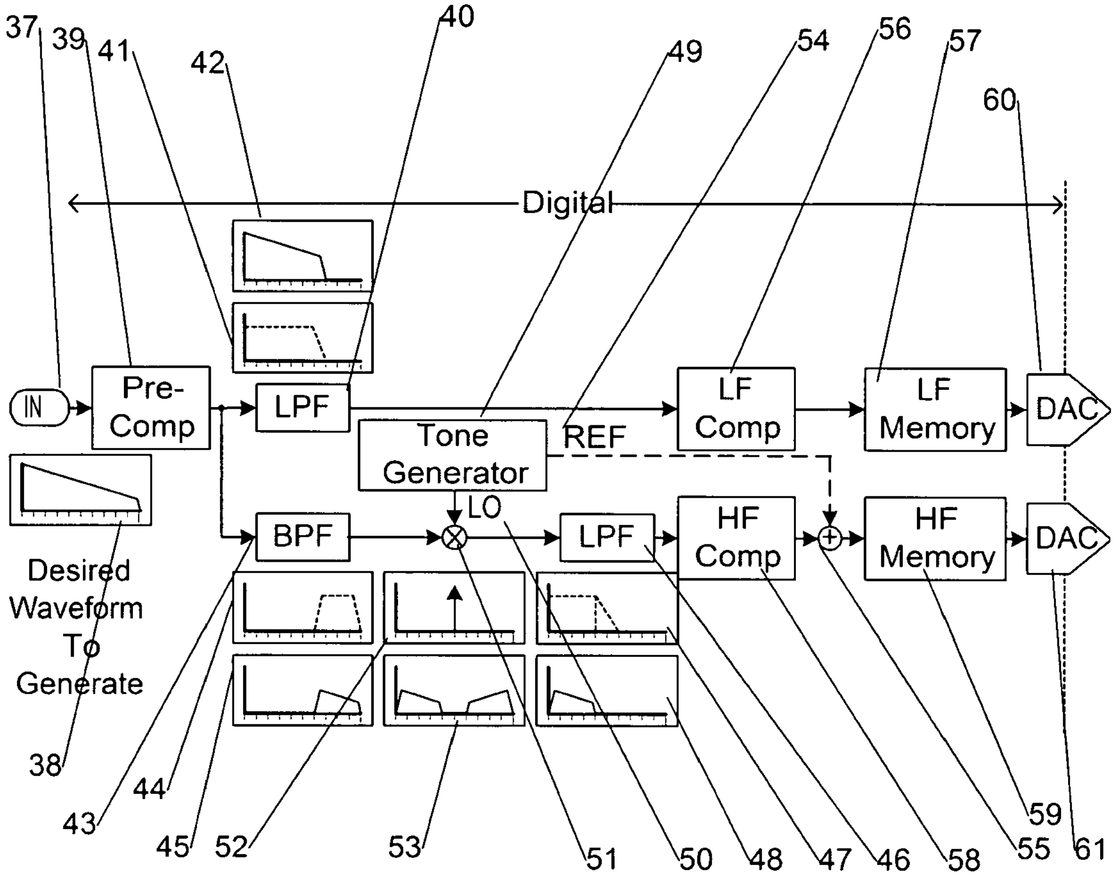
FIG. 3 is a block diagram showing digital signal processing that produces the digital waveforms.

The DSP processing element [2] in FIG. 1 is shown in a preferred embodiment and in detail in FIG. 3. Processing begins with a desired output waveform [38] expressed or capable of being expressed in digital form. Desired output waveform [38] may either exist in memory, or as a formula or function, or can be supplied by up-stream digital signal processing. It is presented to the DSP input [37]. The waveform preferably enters a pre-compensator [39]. Pre-compensator [39] processes the waveform to account for the effects of all downstream processing of the waveform, both digital and analog, and is contrived to alter the waveform in advance, so that after all processing, the output waveform is a substantially correct analog representation of the digital input waveform [37]. The pre-compensation comprises, but is not limited to, magnitude compensation, phase compensation, and non-linearity compensation. In a preferred embodiment, the pre-compensation performs corrections on the digital waveform best performed on the aggregate desired waveform, prior to separation. After pre-compensation, the processing follows two paths of processing. One path, designated the LF path, involves generation of the digital signal to be provided to the LF D/A converter [60]. The other path, designated the HF path, involves generation of the digital signal to be provided to the HF D/A converter [61].

On the LF path, the waveform undergoes low-pass filtering using the low-pass filter (LPF) [40] having ideally a low-pass response characteristic [41]. The LPF extracts the low frequency portion [42] of the waveform to restrict the spectral content to that which can be physically transmitted by the LF D/A converter [60]. Since LF D/A converter [60] has physical limitations, LPF [40] can sometimes be eliminated, but its presence helps in understanding the overall concept. LPF [40] produces a waveform of low baseband spectral content. This waveform then enters preferably an LF compensator [56]. LF compensator [56] is contrived to perform pre-compensation to account for the effects of all downstream processing of the waveform, both digital and analog. It is utilized to compensate for effects that are best compensated for the LF path. These may include, but are not limited to, integral non-linearity (INL) and differential non-linearity (DNL) of the LF D/A converter [60]. Furthermore, even though LF D/A converter [60] is shown as a single converter, it may in fact consist of multiple, interleaved converters, and the LF compensator [56] may also compensate for interleave errors. Finally, phase distortion at band edges may cause distructive signal summing at the diplexer [15] thereby requiring some phase compensation to correct for this.

The LF path is shown with a memory element [57]. LF memory element [57] is utilized as a circular buffer for the waveform, or to provide pipeline delay. In an AWG, it is customary to play waveforms over and over from memory, so the processing of the waveform in the LF path may be performed once after the desired input waveform [37] is known.

Regarding the HF path, the waveform enters a band-pass filter (BPF) [43] having ideally a band-pass response characteristic [44]. BPF [43] serves to extract a high frequency portion [45] of the waveform. Sometimes, this filtering can be avoided as long as images produced downstream do not overlap or alias. Sometimes, also, a rate change is performed either through upsampling (also used to avoid image overlap) or downsampling (to reduce downstream processing requirements). Methods for upsampling and downsampling and their effects are well known to those skilled in the art of digital signal processing. The extracted high frequency portion of the waveform is then mixed (multiplied) with a LO waveform generated by a tone generator [49] at the mixer [51]. The LO generated by the tone generator [49] is generated in a manner whereby it is phase locked in LO is synchronous with the sample clock used to clock the HF D/A converter [61]. Usually, the LO is a single tone or sinusoid, but it can also be a train of impulses, as with a sampler. The intent is that the tone generated anticipates how the analog LO signal [12] is generated and synchronized with the sample clock. Methods for synchronizing the LO signal and the sample clock are described subsequently.

The mixing action of mixer [51] produces images at sum and difference frequencies of the LO waveform spectral content [52] and the mixer input frequency content [45] thereby producing images [53]. Preferrably, the lower frequency image is extracted utilizing LPF [46] with a response characteristic [47] that causes the output of LPF [46] to contain spectral content [48] that appears within the physical bandwidth limitations of the HF D/A converter [61]. This waveform then enters preferably an HF compensator [58]. HF compensator [58] is contrived to perform pre-compensation to account for the effects of all downstream processing of the waveform, both digital and analog, and is utilized to compensate for effects that are best compensated for the HF path. These may include, but are not limited to, integral non-linearly (INL) and differential non-linearity (DNL) of the HF D/A converter [61]. Furthermore, even though HF D/A converter [61] is shown as a single converter, it may in fact consist of multiple, interleaved converters, and the HF compensator [58] may also compensate for interleave errors. Finally, phase distortion at band edges may cause destructive signal summing at the diplexer [15] thereby requiring some phase compensation to correct for this.

The HF path is shown with a memory element [59]. HF memory element [59] is utilized as a circular buffer for the waveform, or to provide pipeline delay. In an AWG, it is customary to play waveforms over and over from memory, so the processing of the waveform in the HF path may be performed once after the desired input waveform [37] is known.

LO Generator [49] is shown producing an LO [50] and also optionally a reference [54]. This optional reference [54] is preferrably a divided down, phase-locked version of the LO [50] and is inserted into the HF waveform at a summing node [55]. The purpose is that for certain methods for LO synchronization, that will be described subsequently require a reference tone inserted in the waveform. Note that this reference can just as well be inserted in the LF path with the typical requirement being that the signal not interfere with the spectral content of the actual waveform.

All of the DSP processing shown in FIG. 3 has been described from a time-domain processing standpoint. It is understood that all DSP processing can be performed entirely in the frequency-domain or in a mixture of domains to have the intended described effect.

Figure 4:
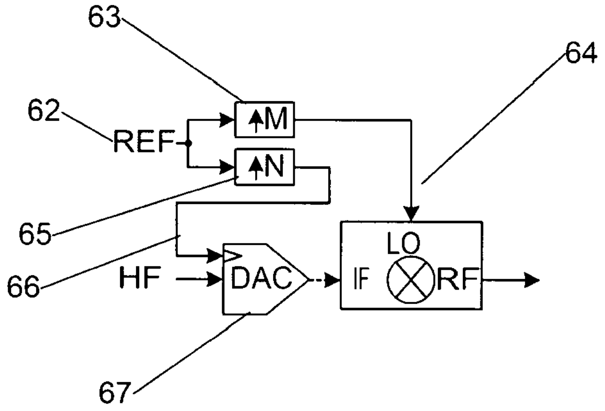
FIG. 4 is a drawing of local oscillator generation using shared references.

At this point it is important to describe how the local oscillator is synchronized with the D/A converter sample clocks. FIG. 4 shows a preferred method. In FIG. 4, a reference [62] is supplied to two frequency multipliers; one multiplier [63] generates the LO signal [64] and another multiplier [65] generates the sample clock [66] supplied to the D/A converter [67]. The multiplication factors are integer and therefore the LO signal [64] and the sample clock [66] are synchronized to each other. This method suffers from the fact that the phase-locked loops usually present in the multipliers must not drift in absolute phase relationship.

Figure 5:
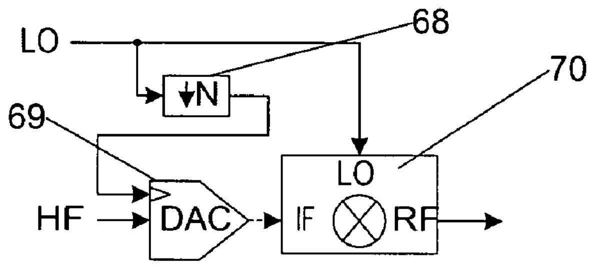
FIG. 5 is a drawing of sample clock generation using a divided down local oscillator.
Figure 6:
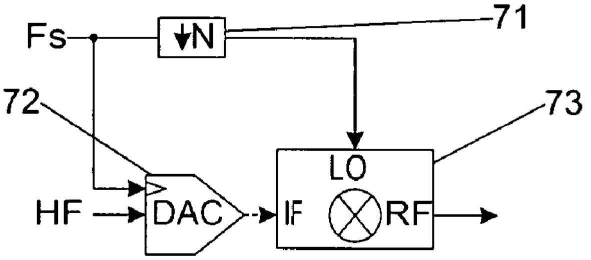
FIG. 6 is a drawing of local oscillator generation using a divided down sample clock.

Other methods may include to derive the LO from the sample clock or vice-versa either by multiplying or dividing one to produce the other. These methods are shown in FIG. 5 and FIG. 6. In FIG. 5, the LO is delivered to the upconverter [70] and a frequency divider [68] divides the frequency delivered to the D/A converter [69]. A frequency multiplier can also be used in place of the frequency divider [68] when it is desirable to have the D/A sample clock higher than the LO frequency. In FIG. 6, the sample clock is delivered to the D/A converter [72] and a frequency divider [71] divides the frequency delivered to the upconverter [73]. A frequency multiplier can also be used in place of the frequency divider [71] when it is desirable to have the LO frequency higher than the D/A sample clock frequency. When using dividers a method is needed to ensure that the correct phase is utilized, either though the use of an overriding set or clear on flip-flops used to divide a waveform in frequency, or through the use of hopping circuitry.

Figure 7:
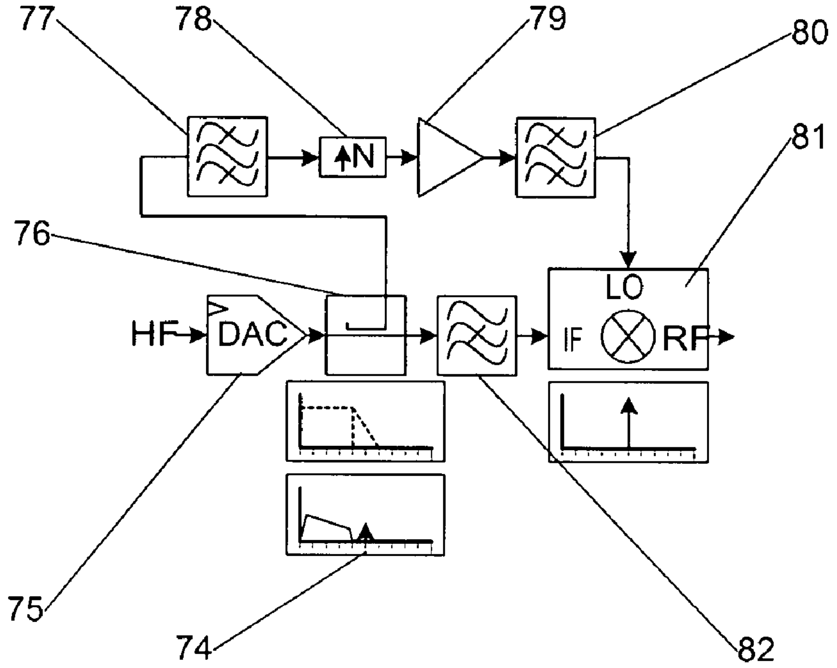
FIG. 7 is a drawing of local oscillator generation using reference tone injection.

FIG. 7 shows another method that does not suffer from the problems inherent in the techniques previously mentioned. In FIG. 7, The spectral content [74] of the signal driven from the D/A converter [75] shows a small reference tone in addition to the HF signal portion. This was the intent of the optional insertion of the reference tone [54] at the reference summing node [55] in the dsp processing in FIG. 3. This reference tone is picked off from the output of the D/A converter [75] through the use of, for example, a coupler [76]. The picked off signal is preferably filtered by BPF [77] to extract the desired reference tone and multiplied by multiplier [78] to generate the desired LO. The LO is preferably amplified by amplifier [79] and filtered by BPF [80] to generate an LO with sufficient power and spectral purity and applied to the LO port of the upconverter [81]. The signal applied to the IF port of the pconverter [81] is filtered with a notch filter [82] if it is determined that the existence of the reference tone in the upconverted signal would cause a problem.

It should be noted that the HF D/A converter [6] generally is not required to be DC coupled. AC coupling relaxes some constraints on the design and usage of the HF D/A converter [6].

While the description of the preferred embodiment involves two spectral bands, one designated as LF and the other HF, with the LF band undergoing no frequency translation, it should be appreciated that this is not a requirement. It is possible for all bands to undergo frequency translation whereby the result is not only a higher bandwidth output waveform; but also a wider bandwidth output waveform where the lower frequency does not extend to DC.

All of the D/A converters utilized do not need to sample at the same rate. Rate requirements are such that the D/A converters and local oscillators can be synchronized and that the rates utilized satisfy Nyquist's criteria.

While the method described utilizes two spectral bands, the limitation to two bands in the description is artificial and only intended to simplify the description. It should be apparent that the method extends to any number of spectral bands and that it is obvious how the methods disclosed can accomplish bandwidth enhancement using more than two D/A converters.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. An apparatus for generating signals comprising;

a digital signal processing element for processing a signal, the digital signal processing element comprising:

a low-pass filter for extracting a low frequency portion of a waveform;

a high-pass filter for extracting a high frequency portion of the waveform; and a mixing element for mixing a local oscillator with the high frequency portion of the waveform to generate a lower frequency version of the high frequency portion of the waveform;

a plurality of digital-to-analog converters, each having a bandwidth and each producing a D/A output signal;

at least one upconverter, the at least one upconverter receiving a D/A output signal and producing an upconverted signal; and a combining element that receives and combines at least one D/A output signal and at least one upconverted signal and produces a final output signal;

whereby the final output signal includes spectral content occupying a substantially contiguous frequency band whose width is greater than the bandwidth of any one of the plurality of digital-to-analog converters.

2. The apparatus of claim 1, wherein the digital signal processing element further comprises a second low-pass filter for extracting the lower frequency version of the high frequency portion of the waveform.

3. A method for generating a signal, comprising the steps of:

digital-to-analog converting a low frequency portion of a desired waveform to generate a lower frequency analog signal;

digital-to-analog converting a lower frequency version of a higher frequency portion of the desired waveform to generate an analog lower frequency version of the higher frequency portion of the desired waveform;

mixing the analog lower frequency version of the higher frequency portion of the desired waveform with a signal from a local oscillator to generate a higher frequency version thereof; and combining the low frequency analog signal and the analog higher frequency version of the higher frequency portion of the desired waveform to generate a combined analog waveform.

4. The method of claim 3, further comprising the step of outputting the combined analog waveform including spectral content substantially identical to the spectral content of the desired waveform.

5. The method of claim 3, wherein the spectral content of the output combined analog waveform covers a frequency range that is greater than the bandwidth of the low frequency portion of the desired waveform.

6. The method of claim 3, wherein the spectral content of the output combined analog waveform covers a frequency range that is greater than the bandwidth of the higher frequency portion of the desired waveform.

7. The method of claim 3, wherein the combined analog waveform is a substantially accurate analog representation of the desired waveform.

8. The method of claim 3, wherein the combined analog waveform spans a frequency range substantially similar to that of the desired waveform.

9. The method of claim 3, wherein the desired waveform is provided as a digital representation.

10. The method of claim 3, wherein the combined analog waveform includes spectral content occupying a substantially contiguous frequency band whose width is greater than the bandwidth of either the low or higher frequency portion of the desired waveform.

11. The method of claim 3, wherein the desired waveform is low-pass filtered to extract the low frequency portion thereof;

wherein the desired waveform is band-pass filtered to extract the higher frequency portion thereof; and wherein the extracted higher frequency portion of the desired waveform is mixed with a signal from a local oscillator to generate the lower frequency version thereof.

12. An apparatus for generating signals comprising;

a digital signal processing element for processing a signal, the digital signal processing element comprising:

a plurality of band-pass filters for extracting a plurality of frequency portions of a waveform; and a mixing element for mixing a local oscillator with one or more of the extracted portions of the waveform to generate a lower frequency version of each of the one or more of the extracted portions of the waveform;

a plurality of digital-to-analog converters, each having a bandwidth and each producing a D/A output signal;

at least two upconverters, each upconverter receiving a D/A output signal from one of the plurality of digital-to-analog converters and producing an upconverted signal; and a combining element that receives and combines the at least two upconverted signals and produces a final output signal;

whereby the final output signal includes spectral content occupying a substantially contiguous frequency band whose width is greater than the bandwidth of any one of the plurality of digital-to-analog converters.

13. The apparatus of claim 12, wherein the digital signal processing element further comprises a plurality of low-pass filters for separating the lower frequency versions of the extracted portions of the waveform from the one or more of the extracted portions of the waveform.

14. The apparatus of claim 13 wherein the digital signal processing element further comprises a plurality of summing elements for summing each of the lower frequency versions of the extracted portions of the waveform with a reference tone phase synchronized with the local oscillator to fix the phase relationship between the one or more extracted portions of the waveform.

* * * * *